United States Patent
Yoshida et al.

(10) Patent No.: US 6,899,110 B2
(45) Date of Patent: May 31, 2005

(54) CLEANING METHOD AND APPARATUS

(75) Inventors: Takashi Yoshida, Tokyo (JP); Motoaki Iwasaki, Tokyo (JP); Tatsuro Yano, Matsumoto (JP); Kurao Habaya, Matsumoto (JP); Takahiro Shiroma, Matsumoto (JP)

(73) Assignee: Fuji Electric Co., Ltd., Kanagawa-ken (JP)

( * ) Notice: Subject to any disclaimer, the term of this patent is extended or adjusted under 35 U.S.C. 154(b) by 371 days.

(21) Appl. No.: 10/177,789

(22) Filed: Jun. 20, 2002

(65) Prior Publication Data

US 2003/0005949 A1 Jan. 9, 2003

(30) Foreign Application Priority Data

Jun. 25, 2001 (JP) .................................... P. 2001-191202

(51) Int. Cl.[7] .................................................. B08B 3/02
(52) U.S. Cl. ........................ 134/107; 134/148; 134/153; 134/172; 134/902
(58) Field of Search ............................... 134/105, 107, 134/172, 181, 148, 153, 902, 56 R, 95.3

(56) References Cited

U.S. PATENT DOCUMENTS

| | | | |
|---|---|---|---|
| 4,798,218 A | | 1/1989 | Sauvan |
| 4,806,171 A | | 2/1989 | Whitlock et al. |
| 5,062,898 A | | 11/1991 | McDermott et al. |
| 5,306,350 A | * | 4/1994 | Hoy et al. ................ 134/22.14 |
| 5,315,793 A | | 5/1994 | Peterson et al. |
| 5,339,844 A | * | 8/1994 | Stanford et al. ............. 134/107 |
| 5,372,651 A | * | 12/1994 | Kodama ...................... 134/26 |
| 5,372,652 A | | 12/1994 | Srikrishnan et al. |
| 5,390,450 A | * | 2/1995 | Goenka ........................ 451/75 |
| 5,403,089 A | * | 4/1995 | Kuo et al. .................... 366/132 |
| 5,598,861 A | | 2/1997 | Danowski et al. |
| 5,934,566 A | * | 8/1999 | Kanno et al. ................ 239/398 |
| 5,942,037 A | | 8/1999 | Wagener et al. |
| 5,973,380 A | * | 10/1999 | Cutter et al. ................. 257/530 |
| 6,239,038 B1 | * | 5/2001 | Wen ........................... 438/745 |
| 6,403,544 B1 | * | 6/2002 | Davenhall et al. ........... 510/175 |
| 6,589,359 B2 | * | 7/2003 | Kamikawa et al. ........... 134/26 |
| 6,612,317 B2 | * | 9/2003 | Costantini et al. ......... 134/58 R |
| 6,706,641 B2 | * | 3/2004 | Worm et al. ................. 438/745 |

FOREIGN PATENT DOCUMENTS

| | | |
|---|---|---|
| DE | 19540373 A1 | 5/1997 |
| JP | 11-300293 | 11/1999 |
| JP | 2000-271547 A2 | 10/2000 |

OTHER PUBLICATIONS

Hoenig, S.A., "Cleaning Surfaces with Dry Ice", *Compressed Air Magazine* Aug., 1986, pp. 22–25.

* cited by examiner

*Primary Examiner*—Frankie L. Stinson
(74) *Attorney, Agent, or Firm*—Hoffmann & Baron, LLP

(57) ABSTRACT

The present invention can remove particles such as dust by flowing solvent gas such as $CO_2$ through a line filter and eject it from a nozzle so as to be converted to solid particles or liquid droplets and eject to a workpiece to be cleaned so as to clean particles or organic materials. It is possible to make the solvent to a solid particle or liquid droplet by adjusting a gap between the nozzle and the workpiece to be cleaned; thus, it is possible to select the most preferable state according to the extent of the adhesion of organic material to the workpiece to be cleaned. Also, it is possible to remove particles such dust in the solvent by a line filter; thus, it is not necessary to use highly pure expensive solvent, and it is possible to reduce the running cost of the apparatus.

8 Claims, 8 Drawing Sheets

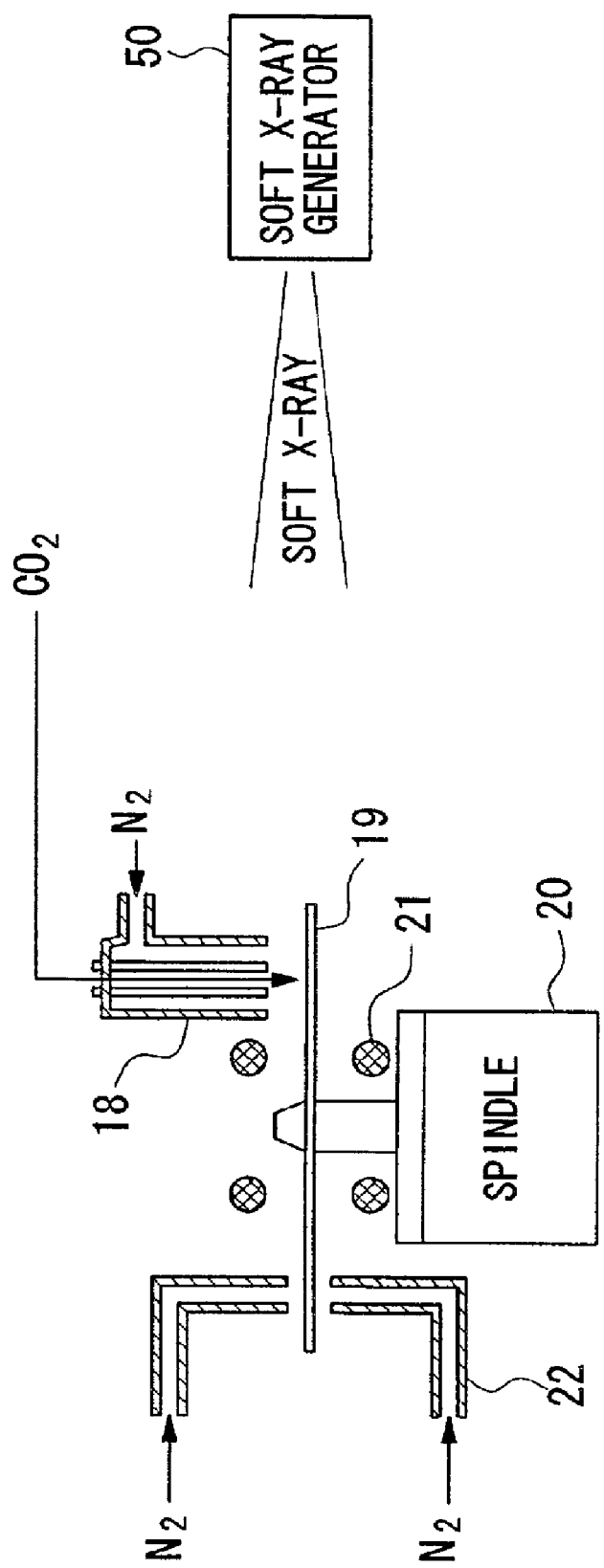

CLEANING METHOD AND APPARATUS

BACKGROUND OF THE INVENTION

1. Field of the Invention

The present invention relates to a cleaning method to clean and remove fine particles and organic deposits on a surface of a hard disk as a medium and on a silicon wafer, and relates to a method for the same.

2. Description of the Related Art

For a medium such as a hard disk, silicon wafer, and a glass plate for manufacturing a liquid crystal display, minimizing defects on the surface, cleaning the surface completely for the purpose of fine manufacturing processes, and removing fine particles and organic deposits are necessary.

For such a cleaning apparatus for cleaning the surface of a silicon wafer and the like, a cleaning apparatus which ejects a $CO_2$ (dry ice) snow jet at the surface of a workpiece for cleaning has been used. In such a cleaning apparatus, high pressure liquid $CO_2$ is ejected from a narrow nozzle to produce $CO_2$ snow. That is, most of the $CO_2$ which is ejected from the nozzle become liquid condensate. The surfaces of such condensates evaporate and carry away the heat of vaporization from the liquid condensates. The liquid condensates from which the heat of vaporization has been removed solidifies and becomes dry ice such as $CO_2$ snow. The $CO_2$ is jetted at the workpiece to be cleaned, and the surface of the workpiece thereby cleaned. The size of the particles of the $CO_2$ snow mostly depends on the size of the liquid condensate droplets In addition, instead of liquid $CO_2$ at normal temperature, a cleaning method in which the liquid $CO_2$ is cooled to the triple point and a mixture of solid, liquid, and gas is ejected for cleaning is proposed. Liquid $CO_2$ cannot exist at temperatures lower than the triple point, and the liquid $CO_2$ immediately solidifies. Also, a part of the gas is cooled down and coheres and solidifies. In this case, the size of the particles of the $CO_2$ also depends on the size of the liquid condensate droplet.

Furthermore, a method in which liquid argon instead of $CO_2$ is cooled down to the triple point, a mixture of solid, liquid, and gas argon is ejected from a nozzle for cleaning has been performed. In this case, the triple point of argon is lower than atmospheric pressure; thus, there is a limitation in such a cleaning method must be performed in a container in which gas pressure is reduced.

In these cleaning process, condensation of moisture in air occurs on the surface of the workpiece when atomspheric air contacts the workpiece to be cleaned, because the workpiece is cooled by $CO_2$ snow. In order to avoid such a case, a stage for mounting the workpiece to be cleaned must be heated by a heater. In a cleaning method in which argon is used, the workpiece to be cleaned must be heated in order to avoid the occurrence of condensation of moisture in air when the workpiece to be cleaned returned to the atmosphere. Also, in order to decrease moisture in the surrounding atmosphere, the region for performing the cleaning operation was sealed, and low dew point gas was filled therein. Furthermore, static electricity was removed by an ionizer so as to prevent the build up of static electrical charge.

However, there were problems in such cleaning apparatuses as follows.

In a cleaning apparatus which used $CO_2$ snow, when particles such as those dust exist in the liquid $CO_2$, such particles may impair the workpiece to be cleaned. This was a problem because it was difficult to remove such particles.

Such particles can be removed by disposing a filter in pipes for conducting the liquid $CO_2$. However, if the pores of the filter are too fine, pressure loss increases when passing through the filter; thus, dry ice is formed downstream of the filter, and it was thereby not possible for the filter to be made with finer pores. For this reason, the fine particles could not be removed.

To deal with this problem, extremely pure liquid $CO_2$ was used in a conventional cleaning apparatus; however, such a cleaning apparatus is extremely expensive operate.

Also, the size of the dry ice snow which are ejected from the nozzle depends on the diameter of the nozzle and the flow rate. However, it is difficult to make a nozzle of smaller diameter due to machine precision limitations; thus, it was also difficult to produce smaller dry ice snow. For this reason, there is a problem in that the cleaning of the workpiece is difficult.

In addition, the cleaning apparatus becomes complicated because it is necessary to retain a workpiece to be cleaned in a sealed container and in a vacuum container when $CO_2$ or argon is used. Thus, there is a problem in that the cost of the apparatus is high.

Furthermore, if solid or liquid cleaning solvent impacts the workpiece to be cleaned, static electrical charge is generated due to the friction with the surface of the workpiece to be cleaned; and thus, particles which were removed once adhere again because of such static electrical charge, and there are cases in which static electrical charge occurs to devices such as FETs (field effect transistor) formed on the surface. There was also a problem in that it was difficult to completely remove static electrical charge by an ionizer.

SUMMARY OF THE INVENTION

Objects of the present invention are to provide a cleaning method and a cleaning apparatus in which the particles such as dust in the solvent can be removed, and by which organic depositions and particles which adhere to a workpiece to be cleaned can be removed efficiently.

In order to solve the above problems, a cleaning method and an apparatus according to the present invention has the following characteristics.

(1) In a first aspect of the present invention, it is possible to adjust the state of the above-mentioned solvent which contacts the workpiece to be cleaned by controlling a distance between the nozzle and the workpiece to be cleaned to be a predetermined value. By doing this, it becomes possible to preferably select a fine particle state in which the particles can be removed effectively and a liquid condensate state in which organic deposits can be removed effectively.

(2) In a second aspect of the present invention, a cleaning apparatus is provided with a temperature maintaining device which maintains the temperature of the solvent at a constant value, pipes which introduce the solvent gas, filters which are disposed at intermediate points of the pipes, and nozzles which are disposed at the other end of the pipes. In such a cleaning apparatus, the distance between the workpiece to be cleaned and the nozzle is maintained at a constant value. Also, in such a cleaning apparatus, by ejecting the solvent from the nozzle at the workpiece to be cleaned, and by controlling the distance between the workpiece to be cleaned and the nozzle, it is possible to control the state of the solvent which contacts the workpiece to be cleaned. It thereby becomes possible to remove fine particles such as dust in the solvent effectively, and it is also possible to select preferably a fine particle state in which the particle can be removed effectively and a liquid condensate state in which organic deposits can be removed effectively.

(3) A third aspect of the present invention, in accordance with a second aspect of the present invention, is characterized in that the nozzle and the workpiece to be cleaned are disposed almost orthogonally, and the distance between the workpiece to be cleaned and the nozzle is controlled so as to be less than a value according to the following formula.

$$\frac{2 \times D \times \sqrt{P_0}}{3} \quad (D = \text{diameter of nozzle, } P_0 = \text{pressure of solvent}).$$

In such a cleaning apparatus, it is possible to preferably select a fine particle state in which the particles can be removed effectively and liquid condensate state in which organic deposits can be removed effectively.

(4) A fourth aspect of the present invention, in accordance with any one of the second or the third aspects of the present invention, is characterized in that the cleaning apparatus controls the temperature maintaining device so as to maintain the pressure of the solvent gas in the container at a constant value. It is thereby possible to control the pressure more easily than the case in which the temperature is controlled directly.

(5) A fifth aspect of the present invention, in accordance with any one of the second to fourth aspects of the present invention, is characterized in that an air operating valve is disposed between the filters and the nozzle. It is thereby possible that the filters are not open to atmosphere so as to maintain a high pressure.

(6) A sixth aspect of the present invention, in accordance with any one of the second to fifth aspects of the present invention, is characterized in that the nozzle has dual pipe structure, and the solvent is ejected from an inner pipe of the nozzle so as to eject the gas for purging from an outer pipe of the nozzle. It is thereby possible that the entire cleaning apparatus to be compact.

(7) A seventh aspect of the present invention, in accordance with any one of the second to sixth aspects of the present invention, is characterized in that the cleaning apparatus is provided with a purging device which injects gas for purging around the workpiece to be cleaned so as to make surrounding atmosphere of the cleaning apparatus to be filled with purging gas, and a heating device which heats the workpiece to be cleaned and prevents the workpiece to be cleaned from having condensation formed thereon. It is thereby possible to prevent such condensation.

(8) An eighth aspect of the present invention, in accordance with seventh aspect of the present invention, is characterized in that the nozzle and the purging device and the heating device are provided unitarily. It is thereby possible that the entire cleaning apparatus to be compact.

(9) A ninth aspect of the present invention, in accordance with any one of the second to eighth aspects of the present invention, is characterized in that the cleaning apparatus is provided with a spindle which rotates the workpiece to be cleaned and a handling device which loads the workpiece to be cleaned and unloads the workpiece to be cleaned therefrom. It is thereby possible that the cleaning apparatus cleans the workpiece to be cleaned uniformly and efficiently.

(10) A tenth aspect of the present invention is characterized in that the cleaning apparatus is provided with a soft X-ray generator which generates soft X-rays, and the soft X-rays which are generated by the soft X-ray generator are emitted to the workpiece to be cleaned so as to neutralize the static charge on the workpiece to be cleaned. It is thereby possible that the cleaning apparatus to completely neutralize the static charge of dielectrifies the workpiece to be cleaned.

BRIEF DESCRIPTION OF THE DRAWINGS

FIG. 7 is a view which shows other embodiments of the present invention.

DETAILED DESCRIPTION OF THE PREFERRED EMBODIMENTS

The present invention will be explained with reference to the drawings.

Figure 1:
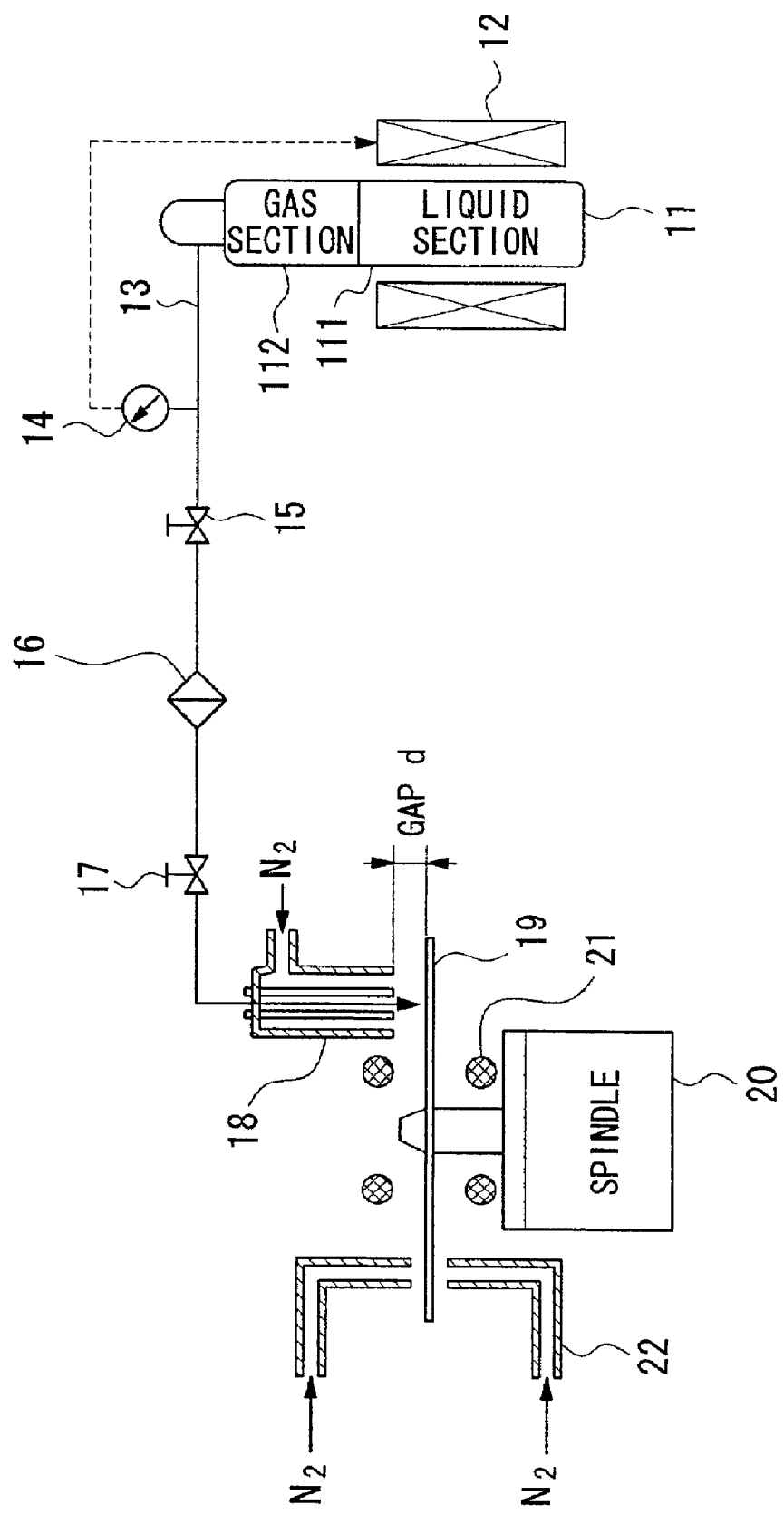
FIG. 1 is a view which shows an embodiment of the present invention.

FIG. 1 is a view which shows an embodiment of the cleaning apparatus of the present invention. In the drawing, reference numeral 11 indicates a tank for $CO_2$ as a solvent. The $CO_2$ therein is separated in a liquid section 111 at a temperature T and gas section 112 at a pressure $P_0$. A reference numeral 12 indicates a heater which maintains the temperature of tank 11 at a constant value.

Reference numeral 13 indicates a $CO_2$ gas line which allows $CO_2$ gas to pass to the outside of the tank 11. Reference numeral 14 indicates a pressure sensor which is disposed at an intermediate point of the $CO_2$ gas line 13 for the purpose of measuring the pressure inside the $CO_2$ gas line 13. The pressure value of this pressure sensor is equivalent to the pressure value $P_0$ at gas section 112. Reference numeral 15 indicates a valve which is disposed at the $CO_2$ gas line 13. Reference numeral 16 indicates a line filter. Reference numeral 17 indicates an air operating valve. Both the line filter 16 and the air operating valve 17 are disposed at a $CO_2$ gas line 13. Also, the tank 11, the line filter 16, the air operating valve 17 are disposed in that order.

Reference numeral 19 indicates a medium such as a hard disk which is an object to be cleanied, and such a workpiece to be cleaned is rotated by a spindle 20. Reference numeral 18 indicates a nozzle, and the nozzle 18 is disposed so as to have a predetermined gap d from the workpiece to be cleaned 19. Nozzle 18 has a double pipe structure. $CO_2$ gas which is introduced from the $CO_2$ gas line 13 is introduced through an inner pipe of the nozzle 18, and a nitrogen gas $N_2$ is introduced through the outer pipe of the nozzle 18. Reference numeral 21 indicates an infrared lamp which heats the workpiece to be cleaned 19. Reference numeral 22 indicates a pipe for a $N_2$ gas purge which ejects nitrogen gas.

Next, operating processes of the present embodiment are explained. The pressure inside the $CO_2$ gas line 13 is measured by the pressure sensor 14 and the heater 12 is controlled so as to maintain the pressure at a constant value. In the tank 11, $CO_2$ gas and liquid $CO_2$ coexist; thus, the pressure $P_0$ in the gas section 112 is equal to a saturated vapor pressure at temperature T in the liquid section 111. There is a one-on-one relationship between the temperature of the liquid and the saturated vapor pressure; therefore, the pressure of the saturated vapor pressure such as in the $CO_2$ gas line 13 can be controlled by controlling the temperature of the liquid section 111 by a heater 12. For example, if the temperature of the liquid is controlled to 22° C., the saturated vapor pressure becomes 60 MPa.

Figure 2:
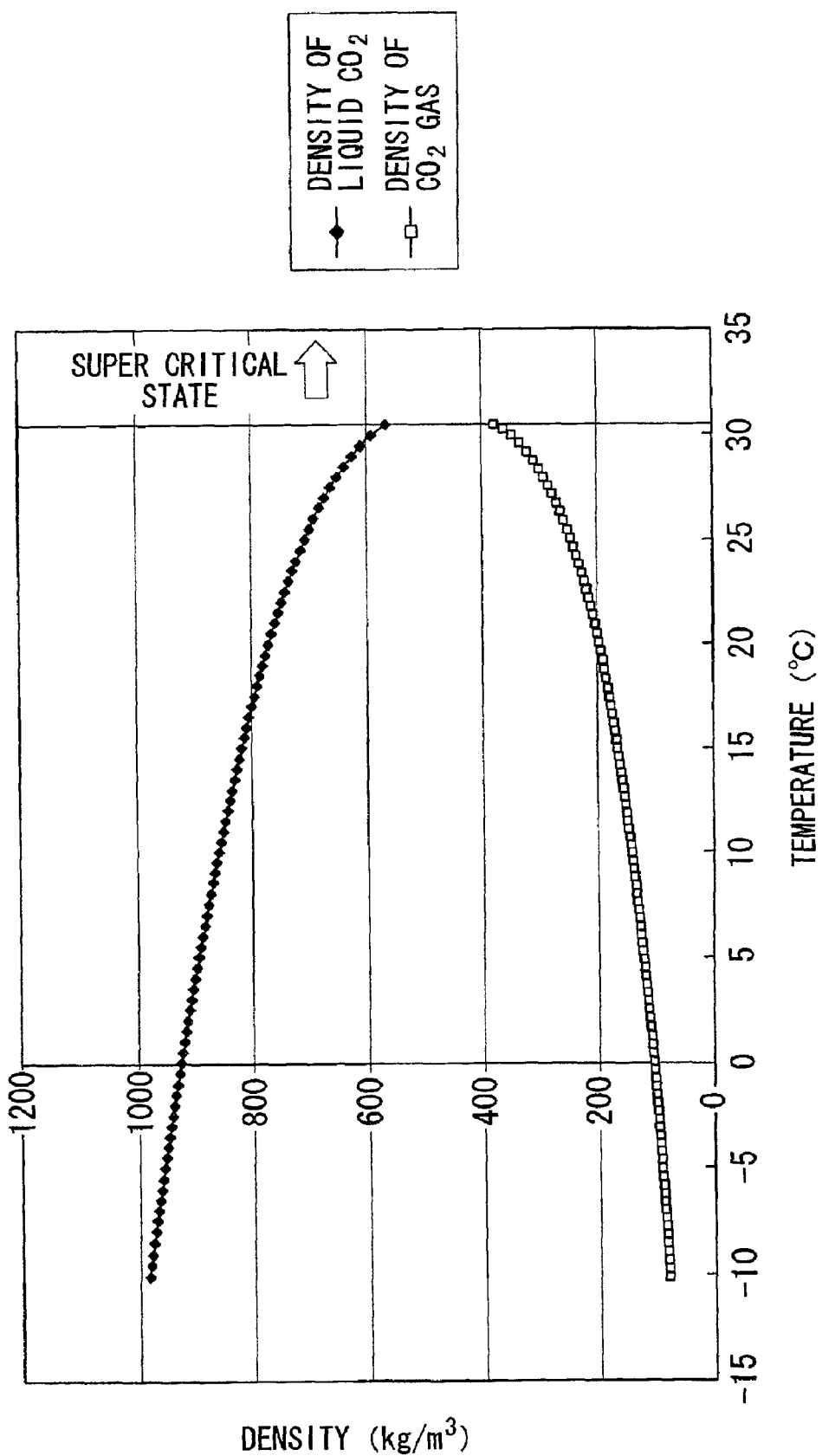
FIG. 2 is a graph which shows a relationship between the temperature and the density of $CO_2$.

In FIG. 2, the relationship between the temperature and the density of $CO_2$ is shown. In the drawing, the upper curve indicates the changes in the density of liquid $CO_2$, and the lower curve indicates the changes in the density of the $CO_2$ gas. The density of the liquid $CO_2$ and the $CO_2$ gas alternates according to temperature, and such transitive behavior becomes noticeable, particularly near the critical point. The transition of the saturated vapor pressure and the density of the gas affects the density of the dry ice which is generated; thus, it is important to control the temperature of the liquid $CO_2$ in the cleaning apparatus from the point of view of stability for $CO_2$ snow generation. As the temperature controlling method is concerned, there must be mentioned a temperature controlling method in which the temperature of the liquid $CO_2$ is directly controlled, and there may also be mentioned a temperature controlling method (actually it should be called a pressure controlling method) in which the heater 12 is controlled so as to maintain internal pressure of the $CO_2$ tank 11 at a constant value by making use of one-on-one relationship between the saturated vapor pressure and the temperature of the liquid. In the embodiment shown in FIG. 1, the latter temperature controlling method is used. The particles which are contained in $CO_2$ gas which flows through the $CO_2$ gas line 13 are removed by the line filter 16, and the $CO_2$ gas is ejected from the nozzle 18 to the workpiece to be cleaned 19. The $CO_2$ which flows through the $CO_2$ gas line is gas; thus, pressure loss does not increase even if a fine pore filter is used for the line filter 16. Therefore, fine particles in the $CO_2$ can be removed. Also, by disposing an air operating valve 17 in an opposite position to the $CO_2$ tank 11 viewed from the line filter 16, the line filter 16 is not open to atmosphere so as to be maintained at a high pressure.

$CO_2$ gas which flows in the $CO_2$ gas line 13 is ejected to the workpiece to be cleaned 19 via an inner pipe of the nozzle 18. The gap d between the nozzle 18 and the workpiece to be cleaned 19 is maintained at a constant value. Also, the workpiece to be cleaned 19 is rotated by the spindle 20; thus, $CO_2$ uniformly is ejected to the workpiece to be cleaned 19. Furthermore, by ejecting low condensation point nitrogen gas from an outer pipe of the nozzle 18 and a pipe 22 for gas purging, and by heating the workpiece to be cleaned 19 by using the infrared lamp 21, condensation is prevented.

Figure 3:
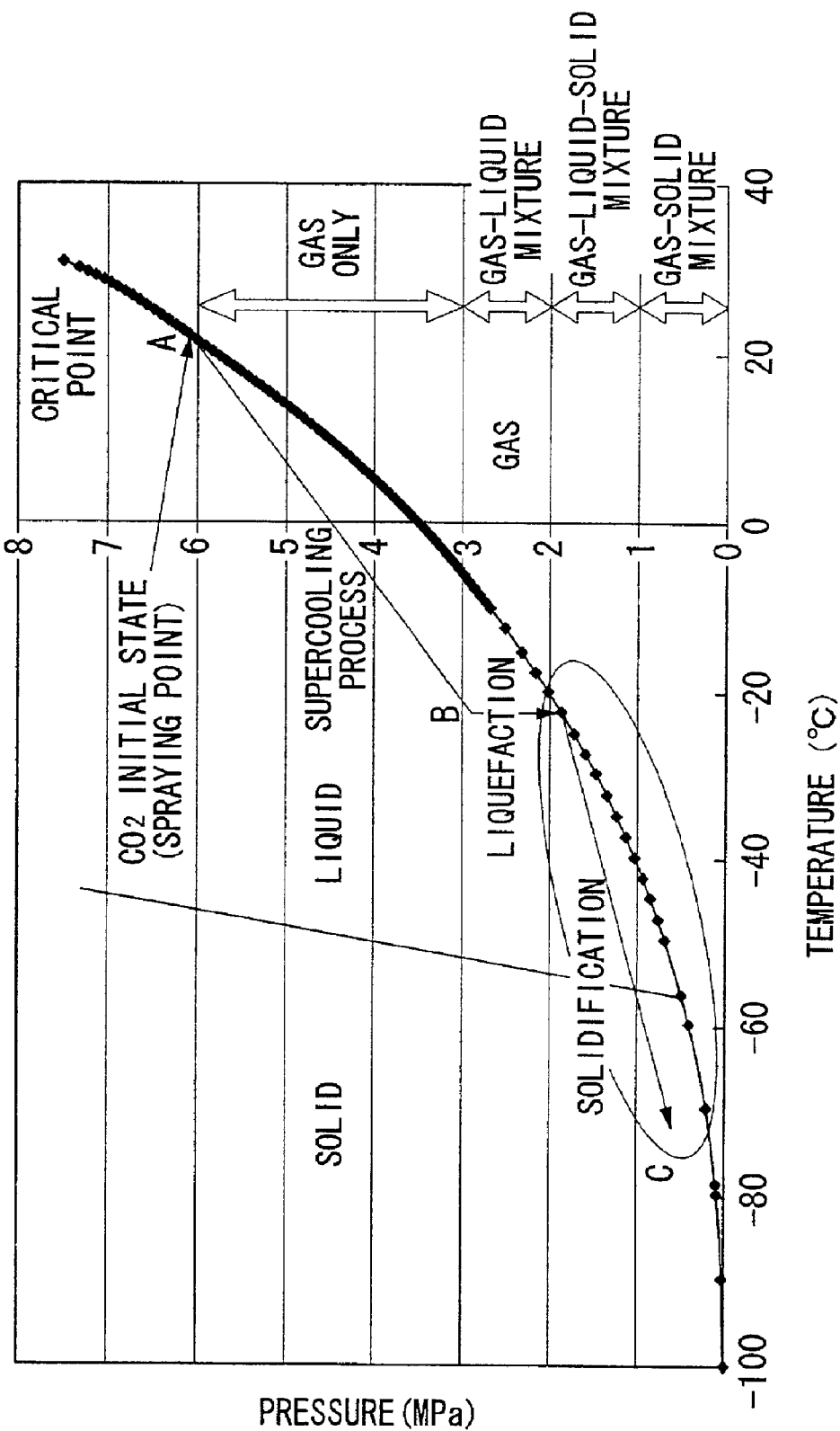
FIG. 3 is a graph which shows a relationship between the temperature and the pressure of $CO_2$.

$CO_2$ gas which is ejected from an inner pipe of the nozzle 18 is cooled down by thermal expansion and finally forms solid particles of dry ice. Such formation of the particles is explained with reference to FIG. 3. FIG. 3 is a view showing a relationship between the temperature and the pressure of $CO_2$. The horizontal axis indicates temperature (° C.), and the vertical axis indicates pressure (MPa). A point "A" in the drawing indicates the state of $CO_2$ when ejected from the nozzle 18, and in this state, $CO_2$ is a gas. This $CO_2$ gas is cooled by thermal expansion, and becomes fine liquid condensed particles at a point "B" due to super cooling.

The temperature of the liquid condensate droplets is low, and the vapor pressure is low compared to the pressure of the gas in the peripheral region; thus, the liquid condensate droplet grows until the peripheral pressure decreases so as to be equal to the vapor pressure of the liquid condensate droplet. If the peripheral pressure decreases to a lower pressure than the vapor pressure of the liquid condensate droplet, the vaporization from the surface of the liquid condensate droplet becomes active, and the temperature of the liquid condensate droplet decreases due to the vaporization heat; thus, the liquid condensate droplet becomes a solid particle such as dry snow. That is, $CO_2$ which is ejected from the nozzle 18 changes from the gaseous state to a mixed gas-liquid state, and changes to gas-liquid-solid mixture state in which gas, solid, and liquid coexist simultaneously. Furthermore, $CO_2$ changes to gas-solid mixture state in which gas and solid particle coexist simultaneously, and then changes to gaseous state.

Such transition has a close relationship with the alteration of the gas pressure due to the expansion of $CO_2$ which is ejected from the nozzle 18. As is understood from a graph in FIG. 3, when the pressure value is 6 to 4 MPa, only gas exists. When the pressure value is 4 to 3 MPa, the $CO_2$ is in a mixed gas-liquid state in which the gas and the liquid coexist simultaneously. When pressure value is 2 to 1 MPa, $CO_2$ is in a mixed gas-liquid-solid state in which the gas, liquid, and solid $CO_2$ coexist simultaneously. When the pressure value is lower than 1 MPa, $CO_2$ is in a mixed gas-solid state in which the gas and the solid particles coexist simultaneously. When injected $CO_2$ travels sufficiently far away from the nozzle and the atmospheric pressure of $CO_2$ becomes equal to atmospheric pressure, $CO_2$ becomes a gas. Such states do not exist continuously, but exist only in a short period of time such as several seconds after being ejected.

Figure 4:
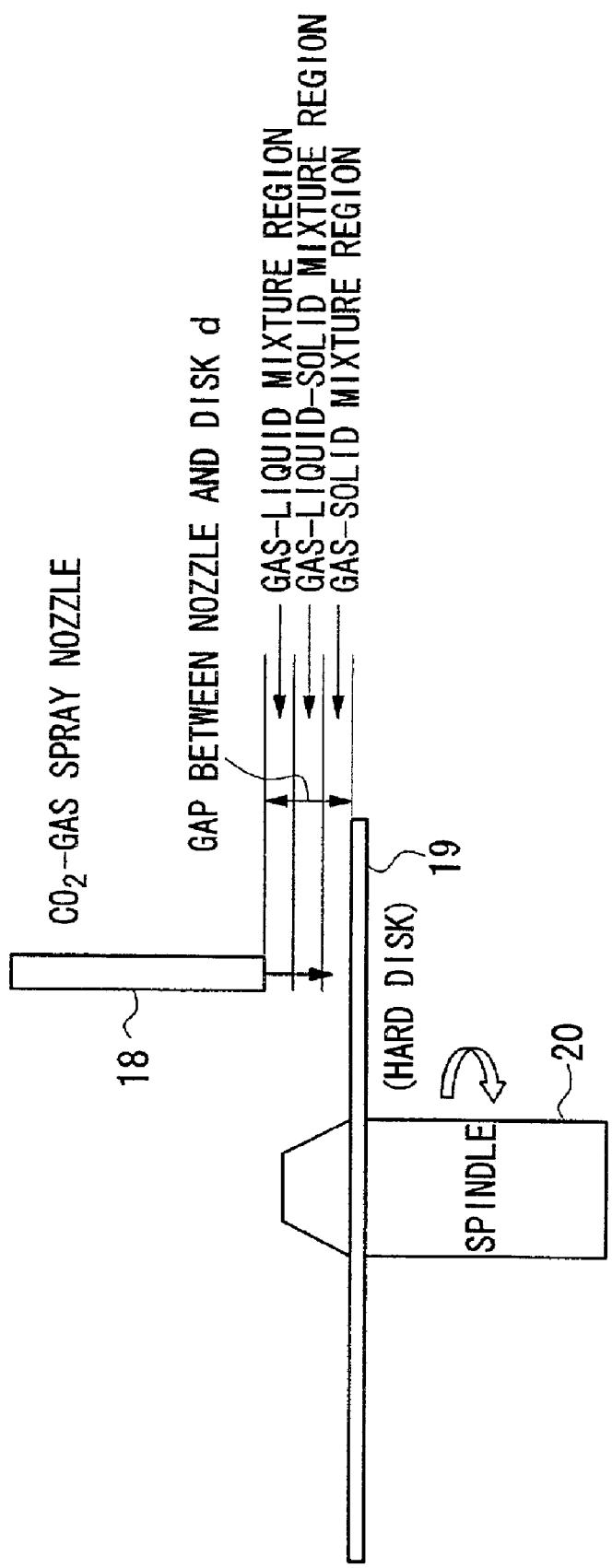
FIG. 4 is a view which explains the state of $CO_2$ in a gap between the nozzle and the workpiece to be cleaned.

By adjusting the distance between the tip of the nozzle 18 and the workpiece to be cleaned 19, the state of $CO_2$ which reaches to the workpiece to be cleaned 19 can be selected. Such a feature is explained in FIG. 4. The same reference numerals are used in FIG. 4 as used in FIG. 1 so as to avoid the duplication of explanation. As far as $CO_2$ which is ejected form the tip of the nozzle 18 is concerned, the pressure of $CO_2$ is highest at the region nearest to the tip of the nozzle 18, and the pressure of $CO_2$ decreases according to the distance from the tip of the nozzle 18. Accordingly, as shown in FIG. 4, the region which is nearest to the tip of the nozzle 18 becomes a gas-liquid mixture region. The region which is in the middle of the nearest region to the tip of the nozzle and the region which is nearest to the workpiece to be cleaned becomes a mixed gas-liquid-solid region. The region which is nearest to the workpiece to be cleaned 19 becomes a mixed gas-solid region. In general, high pressure gas which is ejected from a nozzle is called a "free jet". When ejection pressure $P_0$ of the free jet becomes twice the pressure at the ejection region, the flow rate of the free jet becomes supersonic; thus, shockwaves which are called "Mach disk" are generated. A position $\chi_{md}$ (mm) of the Mach disk from the tip of a nozzle as a center point can be experimentally represented by the following formula.

$$\chi_{md} = \frac{2}{3} D \sqrt{\frac{P_0}{P_b}}$$

In this formula, D indicates nozzle diameter (mm), $P_0$ indicates injecting pressure (kg/cm$^2$), and $P_b$ indicates injected pressure (kg/cm$^2$). When the distance between the nozzle and the workpiece to be cleaned decreases, the pressure $P_b$ in a tiny region therebetween increases. Such an increase can be estimated by observing the position of the Mach disk. In this case, injected pressure $P_b$ can be represented by the following formula.

$$P_b = P_0 \left( \frac{2D}{3\chi_{md}} \right)^2$$

Under conditions in which the injected pressure $P_b$ is atmospheric pressure, the nozzle diameter is 0.3 mm, and the ejecting pressure $P_0$ is 6 MPa, a Mach disk is generated at 1.5 mm position from the central point.

Therefore, when the distance between the nozzle and the workpiece to be cleaned is shorter than 1.5 mm, the pressure in a tiny region between the nozzle and the workpiece to be cleaned increases. The pressure value changes according to the distance between the workpiece to be cleaned and the nozzle. That is, as explained in FIG. 4, by adjusting such a distance, not only the solid $CO_2$ but also the $CO_2$ liquid condensate droplet can be spread to the workpiece to be cleaned.

Although $CO_2$ liquid condensate is slightly inferior in removing the fine particles which adhere to a surface of the workpiece to be cleaned as comparing to solid fine particles, $CO_2$ liquid condensate has a great ability to dissolve organic materials; thus, it can be expected that the dissolution of organic materials is improved, the possible damage to the workpiece to be cleaned is reduced. Therefore, by adjusting the distance between the workpiece to be cleaned and the nozzle according to physical property of the workpiece to be cleaned and the extent of adhesion of organic materials, and by selecting among solid fine particles, liquid condensate, and mixed solid-liquid, spraying of $CO_2$ can be performed to the workpiece to be cleaned.

Figure 5:
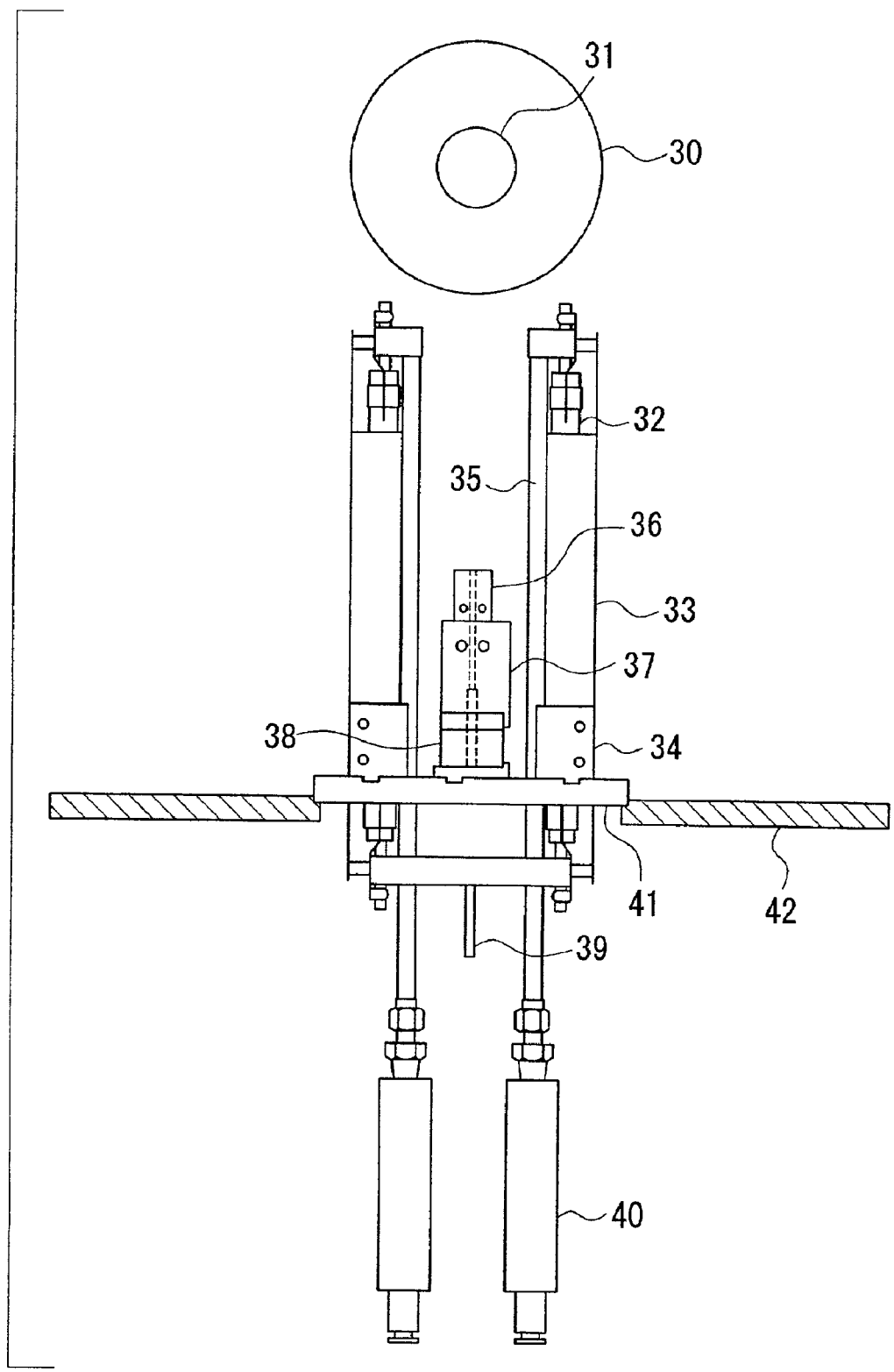
FIG. 5 is a view which shows other embodiment of the present invention.

In FIG. 5, a nozzle and an infrared lamp are shown. In FIG. 5, a reference numeral 30 indicates a workpiece to be cleaned such as a hard disk medium. A reference numeral 31 indicates a clamp for a workpiece to be cleaned which fixes a spindle for rotating the workpiece to be cleaned 30 and a workpiece to be cleaned 30. Reference numeral 32 indicates an infrared lamp which heats the hard disk medium 30. Reference numeral 33 indicates a reflector which reflects infrared ray. Reference numeral 34 indicates a reflector fixing block which fixes the reflector 33. Reference numeral 35 indicates $N_2$ gas purging pipes which inject purging $N_2$ gas to the hard disk medium 30. This $N_2$ gas purging pipe 35 is equivalent to a pipe for $N_2$ gas purge 22 in FIG. 1.

Reference numeral 36 indicates a nozzle assembly which ejects $CO_2$ gas and $N_2$ gas for purging. Reference numeral 37 indicates a nozzle assembly fixing block for fixing the nozzle assembly 36. Reference numeral 38 indicates an X-stage which moves the nozzle assembly 36. Details of the nozzle assembly 36 are explained later. There are four pieces of infrared lamp 32 and four N2 gas purging pipes 35 so as to surround the nozzle assembly 36 and to be positioned on both sides of the hard disk medium 30.

Reference numeral 39 indicates a $CO_2$ injection pipe. $CO_2$ is introduced from this $CO_2$ injection pipe 39 and is ejected to the hard disk medium 30 from the nozzle assembly 36. Reference numeral 40 indicates a $N_2$ gas line filter. Reference numeral 41 indicates a plate for nozzle assembly which fixes a reflector fixing block 34 and an X-stage 38. Reference numeral 42 indicates a base plate which fixes the plate 41 for nozzle assembly.

The infrared lamp 32 and the $N_2$ gas purging pipe 35 are fixed on the reflector 33. The infrared lamp 32 and the $N_2$ gas purging pipe 35 are also fixed on the plate 41 for nozzle assembly by the reflector fixing block 34 so as to always be in constant positioning relationship with the nozzle assembly 36. The plate 41 for nozzle assembly is divided in two pieces, and two pieces of infrared lamp 32 and two $N_2$ gas purging pipes 35 are disposed on each piece of the plate 41 for nozzle assembly. These infrared lamp 32 and two $N_2$ gas purging pipes 35 fixed on the plates 41 heat and purge both front and back sides of each hard disk medium 30.

The plate 41 for nozzle assembly is put on the base plate 42 so as to slide freely thereon. The positioning relationship with the hard disk medium 30 can thereby be adjusted. The base plate 42 is fixed on the Z-stage which is not shown in the drawing, and the entire base plate 42 can perform linear motion in a radial direction of the hard disk medium 30. The nozzle 36 moves from outer part toward the inner part of the hard disk medium 30 and injects $CO_2$ on the surface of the hard disk medium 30. The hard disk medium is rotated; thus, the entire surface of the hard disk medium can be cleaned.

Figure 6C:
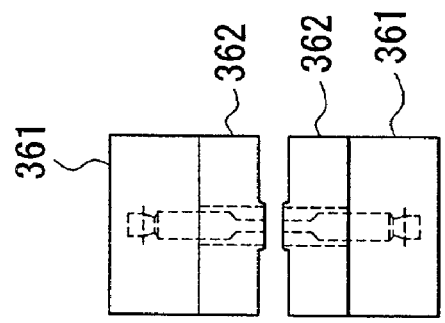
FIGS. 6A, 6B and 6C are views which show a structure of the nozzle.
Figure 6A:
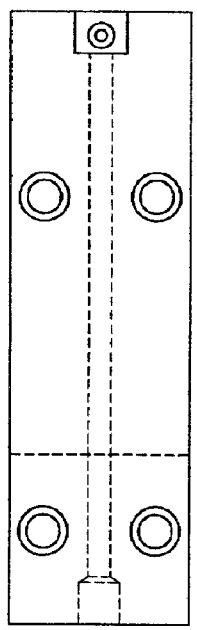
Figure 6B:
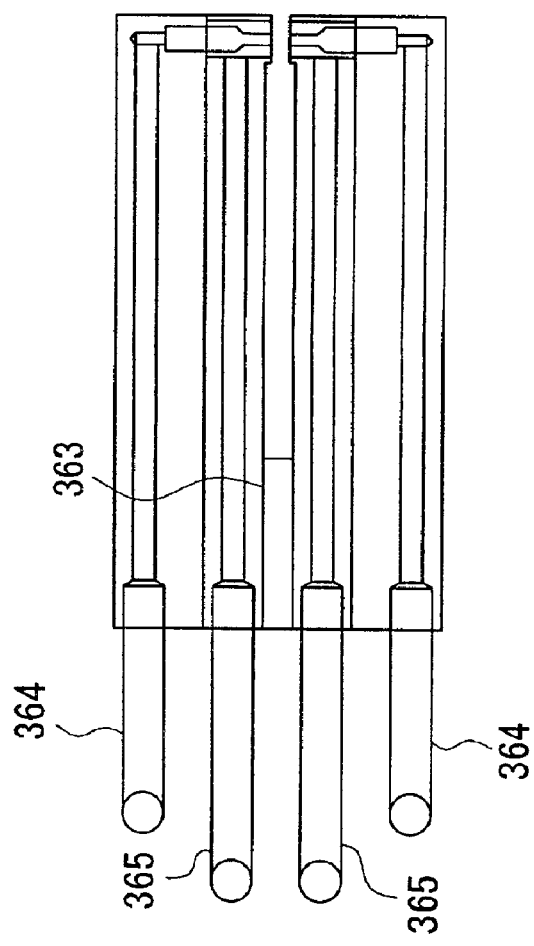

The detail of the nozzle assembly 36 is shown in FIGS. 6A to 6C. Here, dimensions indicated in the drawing are only for reference. FIG. 6A is a top view. FIG. 6B is a front view. FIG. 6C is a side view. Reference numeral 361 indicates a nozzle which injects $CO_2$. On the tip of the nozzle 361, an ejecting nozzle having 0.3 mm of inner diameter is formed. Reference numeral 362 is a $N_2$ purging nozzle which ejects $N_2$ gas. When a hard disk medium is cleaned, both the front surface and the back surface are cleaned simultaneously; thus, these nozzles are disposed so as to vertically face each other. Also, the ejecting section of the nozzle 361 is disposed in an ejecting section of the nozzle 362 so as to form a double pipe structure.

Reference numeral 363 indicates a spacer which adjusts a gap between the two facing nozzle 361 which are disposed vertically. The distance between each nozzle and the hard disk medium 30 is controlled by this spacer 363. Also, the hard disk medium 30 is adjusted so as to be positioned in the center of the facing nozzles 361 by controlling the X-stage 38.

Reference numeral 364 is a pipe. $CO_2$ is introduced from this pipe 364 and is ejected from the nozzle 361 towards the hard disk medium 30. Reference numeral 365 is also a pipe. $N_2$ gas is introduced therefrom, and is ejected from the nozzle 362 towards a peripheral section of the hard disk medium 30. Impurities in the $N_2$ gas are removed by the $N_2$ gas line filter 40. The workpiece to be cleaned is disposed between the nozzles 362 which are facing each other and rotated.

On the nozzle 361, condensation on the tip of the $CO_2$ nozzle 361 occurs when $CO_2$ is ejected due to the cooling because of adiabatic expansion of $CO_2$. In order to prevent such condensation, $N_2$ gas is ejected from the nozzle 362 which is an outer pipe of the double pipe structure. In order to prevent condensation on the surface of the workpiece, the surrounding atmosphere including the entire hard disk medium 30 is purged by $N_2$ gas from $N_2$ purging pipes, and the hard disk medium 30 is heated by the infrared lamp 32. Also, the reflector 33 prevents the peripheral region of the cleaning device from being heated by the infrared ray which is emitted from the infrared lamp 32.

In this way, structures including a nozzle which ejects the cleaning solvent, an infrared lamp $N_2$ purging pipes and for preventing condensation, and a nozzle which ejects $N_2$ gas for purging can be compact.

In FIG. 7, another embodiment of the present invention is shown. The same reference numerals are attached to the structures which are the same as shown in FIG. 1 so as to avoid the duplication of the explanation. In FIG. 7, a reference numeral 50 indicates a soft X-ray generator which generates soft X-ray. The soft X-rays are emitted to the workpiece to be cleaned 19. Stagnation layer of the gas which is generated on the surface of the workpiece to be cleaned 19 are ionized by these soft X-rays so as to neutralize the workpiece to be cleaned.

Figure 8A:
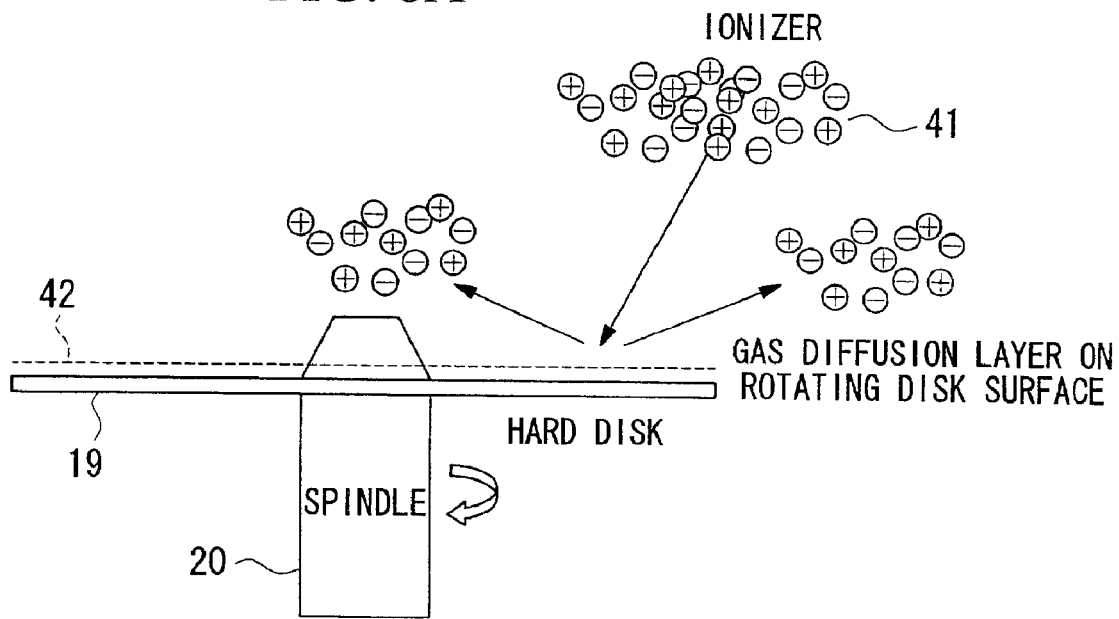
FIGS. 8A and 8B are views which explain the effects of neutralization of static charge.

Effects of the present embodiment are explained with reference to the FIGS. 8A and 8B as follows. Here, same reference numerals are attached to the same structures as shown in FIG. 1 so as to avoid the duplication of explanation. FIG. 8A is showing a case in which ionized gas 41 which is ionized by a conventional ionizer is ejected to the workpiece to be cleaned (hard disk medium) which is rotating. Ionized gas 41 cannot reach a surface of the workpiece to be cleaned 19 because of the stagnation layer 42 in which relative gas flow rate on the surface of the workpiece is nearly equal to zero and molecule of gas transfers only by diffusion process, which is formed on a surface of the workpiece to be cleaned 19. Even if such ionized gas reaches a surface of the workpiece to be cleaned, neutralization takes time; thus, the neutralization of the rotating workpiece to be cleaned cannot be performed effectively.

Figure 8B:
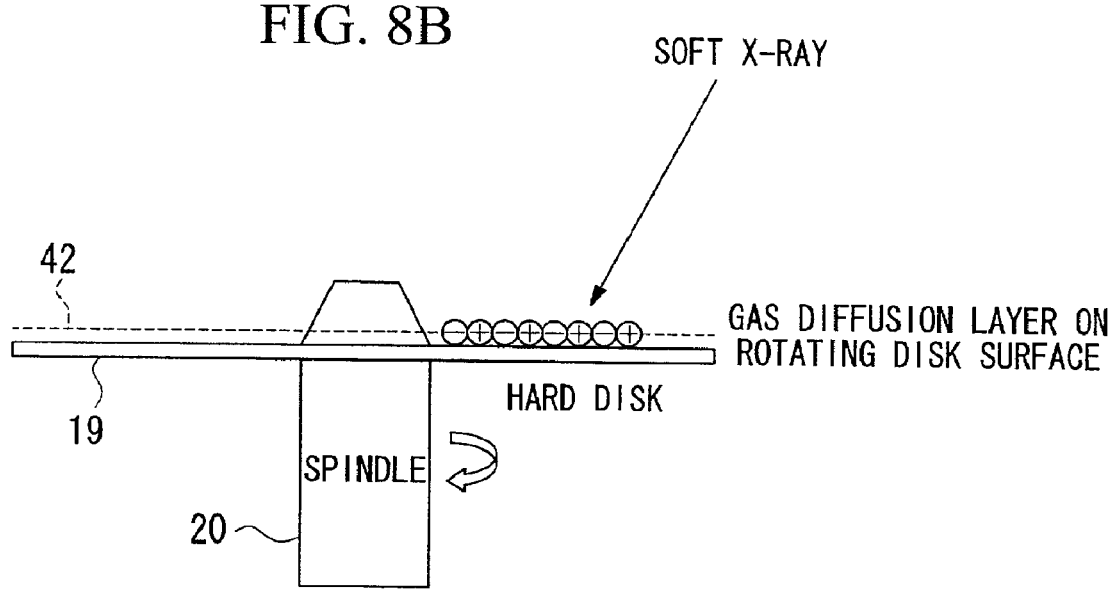

FIG. 8B is a case of the present embodiment. In this embodiment, molecule of gas in the stagnation layer 42 is directly ionized; thus, the rotating workpiece to be cleaned can be cleaned effectively.

As explained above, according to the present invention, the following effects can be anticipated.

According to the first aspect of the present invention, by controlling the distance between the nozzle and the workpiece to be cleaned to a predetermined value, the state of the solvent which reaches the workpiece to be cleaned is adjusted. By doing this, it is possible to preferably select the solid fine particle state by which particles on the surface of the workpiece to be cleaned can be removed effectively and the liquid condensate state in which organic material can be removed effectively. Also, liquid condensate solvent produces less damage to the workpiece to be cleaned as comparing to the solid fine particles; thus, there is an effect in that the workpiece to be cleaned is not damaged.

According to the second aspect of the present invention, the cleaning apparatus is provided with a temperature maintaining device which maintains the temperature of the solvent at a constant value, a pipe which introduces the solvent gas, a filter which is disposed in an intermediate position of the pipe, and a nozzle which is disposed at another end of the pipe. The cleaning apparatus maintains the distance between the workpiece to be cleaned and the nozzle, injects solvent from the nozzle to the workpiece to be cleaned, controls the distance between the workpiece to be cleaned and the nozzle so as to adjust the state of the solvent which reaches the workpiece to be cleaned. By doing this, it is possible to select preferably the solid fine particle state by which particles on the surface of the workpiece to be cleaned can be removed effectively and the liquid condensate state in which organic materials can be removed effectively; thus, there is an effect in that it is possible to select the most preferable state according to the extent of the adhesion to the workpiece to be cleaned.

Also, liquid condensate solvent causes less damage to the workpiece to be cleaned as comparing to the solid fine particles; thus, there is an effect that the workpiece to be cleaned is not damaged.

Also, $CO_2$ can pass through the line filter even if the $CO_2$ is in a gaseous state; thus, the pressure loss does not increase when a fine pore filter is used. Therefore, fine particles having small particle diameter can be removed, and there is an effect that the workpiece to be cleaned is not damaged. Furthermore, there is no need to use highly pure solvent; and therefore the operating cost is low.

According to the third aspect of the present invention, in the second aspect of the present invention, the nozzle and the workpiece to be cleaned are disposed nearly orthogonally, and the distance between the workpiece to be cleaned and the nozzle is regulated so as to be lower than a value which is represented by the following formula.

$$\frac{2 \times D \times \sqrt{P_0}}{3}$$

Here, D indicates a diameter of the nozzle. $P_0$ indicates pressure of the solvent. By doing this, there is an effect that it is possible to select preferably a fine particle state in which the particles can be removed effectively and a liquid condensate state in which organic material can be removed effectively and there is an effect in that it is possible to select the most preferable state according to the extent of the adhesion to the workpiece to be cleaned.

According to the fourth aspect of the present invention, in the second or the third aspect of the present invention, the temperature maintaining device is controlled so as to maintain the pressure of the solvent gas in a solvent container. By doing this, there is an effect in that it is easier to control the temperature of the solvent than in a case in which the temperature of the solvent is controlled directly.

According to the fifth aspect of the present invention, in the second to fourth aspects of the present invention, an air operating valve is disposed between the filter and the nozzle. By doing this, the filter is not open to air and is always maintained at a high pressure region; thus, there is an effect in that it is possible to prevent trouble that the filter is broken due to an excessive pressure difference.

According to the sixth aspect of the present invention, in the second to fifth aspects of the present invention, the nozzle has a double-pipe structure, the solvent is ejected from the inner pipe of the nozzle, and the purging gas is ejected from the outer pipe of the nozzle. By doing this, it is possible to eject the purging gas and the solvent from one nozzle; thus, the entire structure of the cleaning apparatus can be compact.

According to the seventh aspect of the present invention, in the second to sixth aspects of the present invention, the cleaning apparatus is provided with a purging device which ejects purging gas to periphery of the workpiece to be cleaned so as to make the periphery of the cleaning apparatus in an atmosphere of purging gas and a heating device which prevents condensation by heating the workpiece to be cleaned. By doing this, there is an effect that the condensation can be completely prevented.

According to the eighth aspect of the present invention, in the seventh aspect of the present invention, the nozzle, the purging device, and the heating device are in one unit; thus, there is an effect that the entire structure of the cleaning apparatus can be compact.

According to the ninth aspect of the present invention, in the eighth aspect of the present invention, the cleaning apparatus is provided with a spindle which rotates the workpiece to be cleaned and a handling device which loads the workpiece to be cleaned to the spindle and unloads it therefrom. By doing this, there is an effect that the cleaning operation is operated uniformly and efficiently.

According to the tenth aspect of the present invention, the cleaning apparatus is provided with a soft-X-ray generator which generates soft X-rays. In the cleaning apparatus, the soft X-rays which are generated by the soft-X-ray generator are emitted to the workpiece to be cleaned so as to neutralize the workpiece to be cleaned. By doing this, it is possible to neutralize the workpiece to be cleaned perfectly even during rotation; thus, there is an effect that the adhesion of organic material and an electrostatic damage to formed elements does not occur.

What is claimed is:

1. A cleaning apparatus comprising:

a container in which solvent is sealed therein;

a temperature maintaining device which maintains the temperature of the solvent at a constant value;

a $CO_2$ gas line which introduces solvent gas contained in the container;

a line filter which is disposed in an intermediate position in the $CO_2$ gas line;

a nozzle which is disposed at another end of the $CO_2$ gas line; wherein the distance between the workpiece to be cleaned and the nozzle is maintained at a constant value;

the solvent is ejected from the nozzle toward the workpiece to be cleaned;

the state of the solvent which reaches the workpiece to be cleaned is adjusted by controlling the distance between the workpiece to be cleaned and the nozzle.

2. A cleaning apparatus according to claim 1, wherein a nozzle and a workpiece to be cleaned are disposed nearly orthogonally;

a distance between the workpiece to be cleaned and he nozzle is controlled so as to be lower than a value which is represented by the formula $$\frac{2 \times D \times \sqrt{P_0}}{3}$$ ($D$ = diameter of nozzle 18, $P_0$ = pressure of solvent).

3. A cleaning apparatus according to claim 1, wherein a temperature maintaining device is controlled so as to maintain the pressure of solvent gas sealed in a container.

4. A cleaning apparatus according to claim 1, wherein an air operating valve is disposed between a line filter and a nozzle.

5. A cleaning apparatus according to claim 1, wherein a nozzle has double-pipe structure;

solvent is injected from an inner pipe of the nozzle;

purging gas is injected from an outer pipe of the nozzle.

6. A cleaning apparatus according to claim 1, wherein a purging device which injects purging gas to the periphery of the workpiece to be cleaned so as to make a surrounding of the workpiece to be cleaned be in purging gas atmosphere and a heating device which heats the workpiece to be cleaned so as to prevent condensation are provided.

7. A cleaning apparatus according to claim 6, wherein a nozzle, a purging device, and a heating device are in one unit.

8. A cleaning apparatus according to claim 1, wherein a spindle which rotates a workpiece to be cleaned and a handling device which loads the workpiece to be cleaned to the spindle and unloads therefrom are provided.

* * * * *